United States Patent [19]

Bryant

[11] 3,958,126
[45] May 18, 1976

[54] LOGIC CIRCUITRY

[75] Inventor: Jack A. Bryant, Boston, Mass.

[73] Assignee: Electronics Corporation of America, Cambridge, Mass.

[22] Filed: Nov. 25, 1974

[21] Appl. No.: 526,504

[52] U.S. Cl.............................. 250/554; 250/551; 340/227 R; 431/24
[51] Int. Cl.² .......................................... G02B 27/00
[58] Field of Search........ 250/551, 552, 554, 214 R; 431/24, 25, 26; 340/227, 228.2

[56] References Cited
UNITED STATES PATENTS

| | | | |
|---|---|---|---|
| 3,613,062 | 10/1971 | Bloice | 340/228.2 |
| 3,684,423 | 8/1972 | Bryant | 431/24 |
| 3,710,149 | 1/1973 | Thomson | 250/554 |

Primary Examiner—Alfred E. Smith
Assistant Examiner—D. C. Nelms

[57] ABSTRACT

A burner control system has a field device and control logic for providing a control signal to change the state of the field device. A comparator that compares signals from field and the control logic comprises translation circuitry that is arranged to produce an output pulse train signal in response to a corresponding input pulse train signal, and power supply circuitry that has two logic inputs. The power supply circuitry supplies power to the translation circuitry only in response to a proper comparison between a field signal applied to one logic input and the control signal applied to the other logic input.

12 Claims, 3 Drawing Figures

3,958,126

LOGIC CIRCUITRY

SUMMARY OF INVENTION

This invention relates to burner control circuitry and logic circuitry particularly useful in connection with burner control systems of the type that are arranged to sense conditions at a number of different locations in the burner system and to control output devices such as ignitors and fuel valves as a function of the sensed conditions. A potentially explosive condition can result if, for example, fuel is flowed into the combustion chamber without being ignited, or fuel continues to flow into the combustion chamber after the flame is extinguished. The reliable operation of the system which controls such output devices is therefore of considerable importance. It is desirable that the components of the control system be arranged so that if failure does occur, the system will be placed in a safe condition so that fuel does not accumulate in the combustion chamber.

Burner control systems of the type in which the invention may be employed are disclosed in my U.S. Pat.No. 3,684,423 and my copending application Ser. No. 397,640, filed Sept. 17, 1973 and entitled "Burner Control System." In such systems, the burner control logic includes a comparator or exclusive OR circuit for comparing a signal from the burner control logic and the field condition controlled by the logic, for example the state of a controlled fuel valve. It is an object of this invention to provide improved burner control systems. Another object is to provide improved fail safe comparator logic of the type useful in a burner control system of that type.

Comparator logic in accordance with the invention includes a fail safe self-checking circuit that comprises translation circuitry having a signal input terminal, a signal output terminal and first and second power supply conductors, and that is arranged to produce a pulse train signal at the output terminal in response to a pulse train signal applied to the signal input terminal. That circuit also includes power supply circuitry connected to the power supply conductors that has first and second logic inputs and is arranged to apply power to the power supply conductors in response to a first set of control signals applied to the logic inputs and to remove power from the power supply conductors in response to a different set of logic signals applied to the logic inputs.

In a particular embodiment, the translation circuitry includes first and second photomodule circuits, each photomodule circuit including a radiation source and a radiation sensor, and circuitry connecting the radiation sensor of the first photomodule circuit to control the energization of the radiation source of the second photomodule circuit; and the power supply circuitry includes a diode bridge network.

In a burner control system burner, control logic provides a control signal to change the state of a field device such as a fuel valve, and comparator logic compares a field signal from the fuel valve and the control signal. The power supply circuitry is arranged to apply power to the translation circuitry in response to a proper comparison between the field and control signals and to remove power from the translation circuitry when the field and control signals do not properly compare. When properly powered, the translation circuitry responds to a pulse train signal to apply power to the fuel valve.

Other objects, features and advantages of the invention will be seen from the following description of particular embodiments, in conjunction with the drawings, in which.

DESCRIPTION OF PARTICULAR EMBODIMENTS

Figure 1:
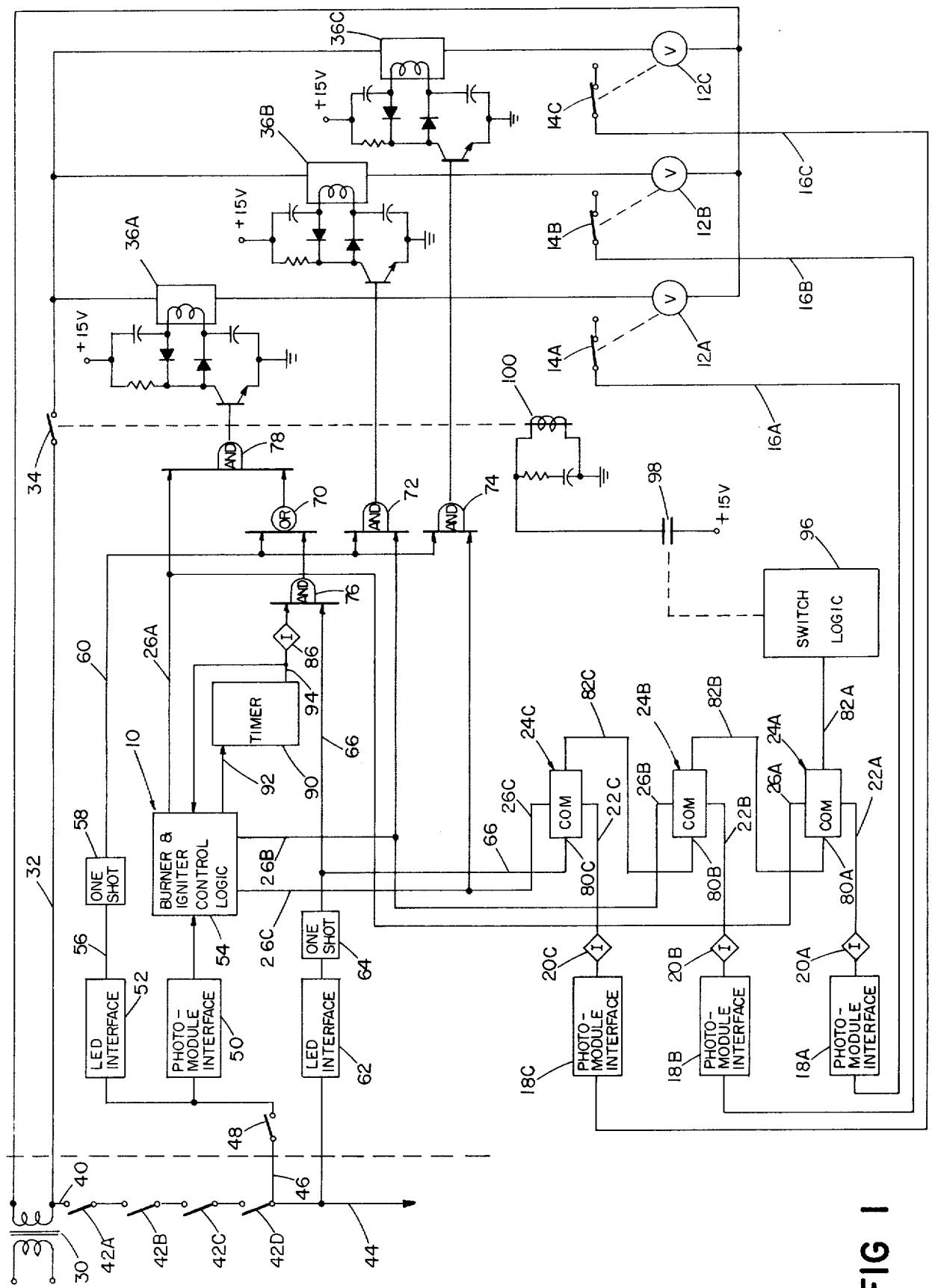
FIG. 1 is a combined block and schematic diagram of a burner control system incorporating comparator logic in accordance with the invention.

The system shown in FIG. 1 is a simplified showing of a burner control system with logic indicated by block 10 that produces outputs for controlling a pilot fuel valve solenoid 12A, an oil valve solenoid 12B and a gas valve solenoid 12C. Associated with each valve is a limit switch 14 which is closed when its valve is closed, and which provides a signal over line 16 through a photomodule interface 18 to comparator logic 24 and inverter 20 and line 22. Thus, a signal is applied on line 24A if the pilot valve 12A is not closed, in response to open limit switch 14A.

Comparator logic 24A has a second input (pilot fuel request) on line 26A from the burner and igniter control logic 10. Similarly comparator logic 24B has an oil request signal from burner and igniter control logic on line 26B and comparator logic 24C has a gas request signal on line 26C.

Transformer 30 provides power over line 32 and through contacts 34 to energize the valve solenoids 12 through switch units 36. Also connected to the output of transformer 30 is line 40 in which are connected in series a set of trip contacts 42 which respond to condition signals from the controlled burner system. (Line 44 extends to other similar burner control circuits of other burners.) Extending from line 44 is line 46 in which is connected a normally open flame sensor switch 48 which is closed when flame is detected and thus applies the "no trip" signal on line 44 and a "flame detected" signal to interface circuits 50 and 52. The output of interface 50 on line 54 applies a steady state flame signal to the burner and igniter control logic 10, while the output signal from interface 52 one line 56 is applied to one shot 58 which generates a pulse train flame signal on line 60. A third interface 62 (similar to interface 52) and one shot circuit 64 converts the steady state "no trip" signal on line 44 to a pulse train signal on line 66 that indicates there are no system trip conditions present.

Each pulse train signal has a period corresponding to the power frequency about 16 milliseconds for 60 Hertz power and about 20 milliseconds for 50 Hertz power and is applied to logic components. The pulsing flame signal on line 60 is applied to OR circuit 70 and AND circuits 72 and 74, while the pulsing "no trip" signal on line 66 is applied to AND circuit 76 and to comparator circuit 24C and input line 80C. OR circuit 70 has a second input from AND circuit 76 and its output is applied to AND circuit 78. AND circuit 72 has a second input (oil valve control) from control logic 10 on line 26B; AND circuit 74 has a second input (gas valve control) on line 26C; and AND circuit 78 has a second input (pilot valve control) on line 26A. The output of each AND circuit 72, 74 and 78 is a pulse train signal which is applied to a control circuit for a switch circuit 36. The output of AND circuit 72 closes switch 36B, the output of AND circuit 74 closes switch 36C, and the output of AND circuit 78 closes switch 36A. AND circuit 76 has a second input from inverter 86 which has an input from ignition timer 90 which in turn is triggered by an ignition start signal from logic 10 over line 92. The output signal from timer 90 is removed from line 94 during the timing interval so that inverter 86 applies a controlling signal to AND circuit 76. The signal on line 94 is fed back to the control logic 10 to provide an indication to the control logic that the ignition interval is complete.

The "no trip" pulse train signal on line 66 is applied to input 80C of comparator 24C, and if the signals on lines 22C and 26C properly compare, that comparator has a pulse train output on line 82C which is applied to input 80B of comparator 24B. If the input signals on lines 22B and 26B of comparator 24B properly compare, that comparator similarly has an output on line 82B which is applied to input 80A of comparator 24A. If the input signals on lines 22A and 26A properly compare, comparator 24A has a pulse train output on line 82A which is applied to solid state switch control circuit 96 that closes switch 98 to energize solenoid 100 and close switch 34.

Thus, in this simplified burner control system, a field trip condition signal in the form of a pulse train on line 66 is applied serially through comparators 24C, 24B and 24A to energize solid state switch control 96 which in turn closes switch 98 to energize solenoid 100 and apply power to the valve control switches 36 through switch 34. Switches 36 are similarly closed by pulse train signals from digital logic circuits 72, 74 and 78 which are conditioned by control signals from burner and igniter control logic 10 to pass the flame indicating pulse train signal applied on line 60 when flame relay contacts 48 are closed in response to a signal indicating the detection of flame. The "no trip conditions present" pulse train signal on line 66 is also applied to AND circuit 76 and through OR circuit 70 and AND circuit 78 during an ignition interval controlled by timer 90.

In operation of this simplified system, the valves 12A, 12B and 12C are initially closed and no valve open signals are generated by control logic 10 on lines 26A, 26B, and 26C. In this condition, the limit switches 14A, 14B and 14C are closed and apply signals on lines 16A, 16B and 16C through interface logics 18 to inverters 20 and thus remove signals from lines 22. As the signals on lines 22 and 26 of each comparator properly compare, the pulse train signal is serially passed by those comparators to energize switch control circuit 96 which in turn energizes solenoid 100 to close switch 34. In response to a request for ignition, logic 10 generates a pilot valve open command signal on line 26A and a signal on line 92 to start the ignition timing interval. The timer 90 output conditions AND circuit 76 and the no trip pulse train on line 66 is passed by AND circuit 76 and OR circuit 70 and conditioned AND circuit 78 to close switch 36A and energize solenoid 12A to open the pilot valve. When the pilot valve starts to open (leaves its closed position), limit switch 14A opens and the field signal on line 16A is removed, thus causing inverter 20A to produce an output signal which is applied to input 22A of comparator 24A. As the open pilot valve signal on line 26A from burner logic 10 properly compares with that signal the comparators continue to pass the no trip pulse train signal to maintain switches 98 and 34 closed.

As soon as flame is detected in the supervised combustion chamber, switch 48 closes and the resulting signal is applied through interface 50 to control logic 10 and also through interface 52 to energize one shot 58 to produce a flame present pulse train signal on line 60 which is applied through OR circuit 70 to AND circuit 78 to maintain switch 36A closed as long as there is an open pilot valve signal on line 26A from control logic 10. The flame pulse train on line 60 is also applied to AND circuits 72 and 74, and the control logic 10, in response to the flame present signal on line 54 as a function of the appropriate fuel (gas or oil) generates a signal to open the corresponding valve for the selected fuel which "open valve" signal is applied on line 26B or 26C. That signal conditions AND circuit 72 or 74 to pass the flame detected pulse train signal to close the corresponding switch 36 and energize the corresponding valve solenoid 12, and also as an input to the corresponding comparator 24. As soon as the valve starts to open, its limit switch 14 opens and the inverter 20 produces a signal on line 22 to the comparator. The comparator senses this satisfactory comparison and continues to provide a gate path for the passage of the burner condition satisfactory pulse train signal on line 66 to maintain switch 34 closed.

If the field condition indicated by the limit switch 14 and the condition request signal from logic 10 do not properly compare for an interval longer than the delay interval provided by switch control circuit 96, that control circuit will open switch 98 and open the power control switch contacts 34 deenergizing the valve solenoids so that the valves close, promptly shutting down the burner system in safe condition. Thus, in this system the field status (in this example fuel valves) signals are fed back and compared with output commands from the control logic. Any discrepancy will result in a burner trip condition.

Figure 2:
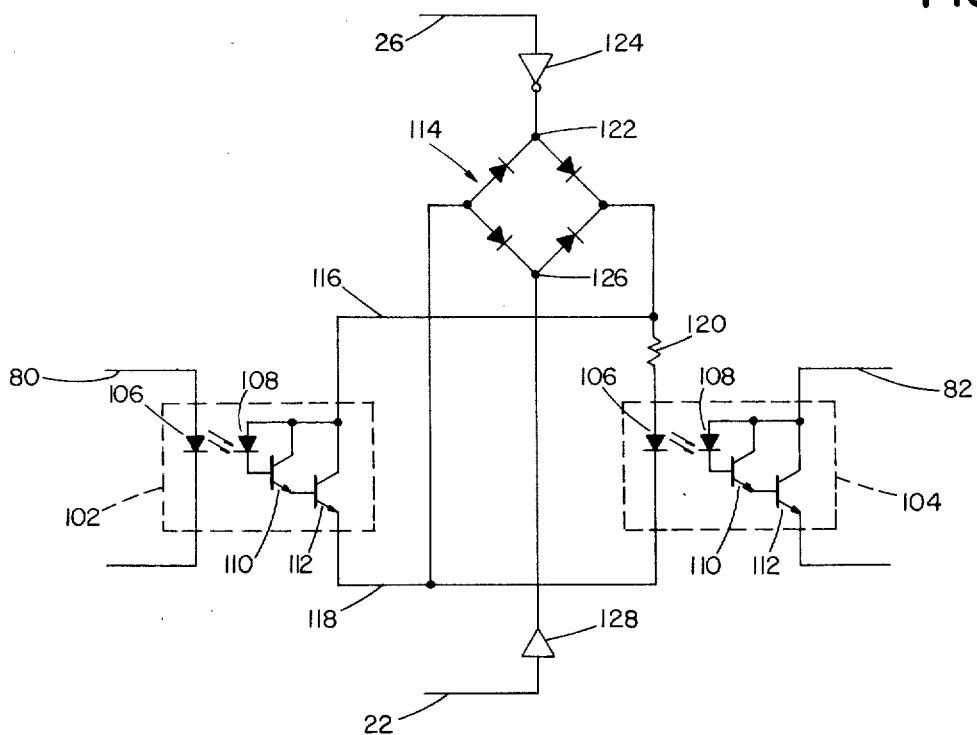
FIG. 2 is a schematic diagram of a comparator circuit in accordance with the invention.

Details of a comparator circuit 20 may be seen with reference to FIG. 2. That circuit includes two optically coupled isolators 102, 104 (e.g. Clairex Type CL1-10), each of which includes an LED light source 106, a photodiode 108 that is optically coupled to light source 106 and two stages of transistor amplification 110, 112. A power supply circuit in the form of a diode bridge array 114 (e.g. Varo Type VE-47) is connected to supply buses 116, 118 which in turn are connected to the photo-diode-transistor portion of isolator 102, and through resistor 120 to light emitting diode portion of isolator 104. Connected to the supply input 122 of bridge array 114 is CMOS buffer amplifier 124 that has an inverted output, and connected to input 126 of bridge array 114 is CMOS buffer amplifier 128 whose output is not inverted. The signal on line 26 is applied to buffer amplifier 124 and the signal on line 22 is applied to buffer amplifier 128. When the signals on lines 22 and 26 are the same, a voltage of about fifteen volts is developed across the bridge array 114 and supplies power to buses 116 and 118. When the signals at the two logic points 22, 26 are not the same, no voltage is developed across array 114, removing power from the isolator circuits 102, 104 and blocking the transmission of a pulse train on output line 82 in response to an input pulse train on input line 80.

The buffers 124, 128 have high impedance inputs and the circuitry supplies a current through the bridge array 114 to the isolator circuits in the order of about 10 milliamperes. When the transistor 112 of isolator 102 is conducting, it shunts the LED of isolator 104 and thus the comparator is inverting the respect to the pulse train which aids in balancing the load on the power supply where a number of these comparator circuits are used in a system. In an alternative embodiment, a transistor switch responsive to photodiode 108 of isolator 102 is connected in series with LED 106 of isolator 104 and transistors 110, 112 are omitted.

Figure 3:
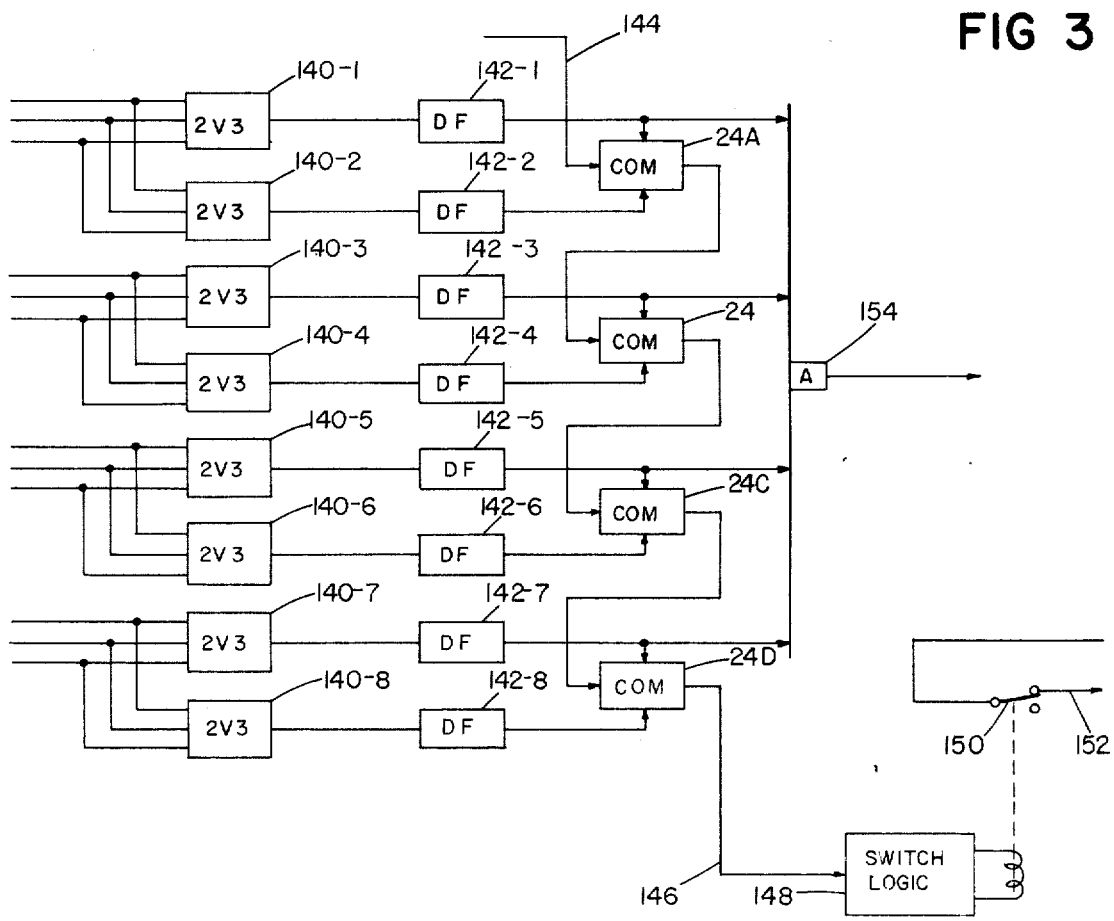
FIG. 3 is a block diagram of another embodiment of a logic system in accordance with the invention.

Another logic arrangement of comparator circuits is shown in FIG. 3. In this arrangement, comparators 24 are used to compare the outputs of channel pairs of two out of three majority logic circuits 140. Connected between each logic unit 140 and the comparator 24 is a digital filter 142 which has a timing tolerance to provide a time delay so that the system will not trip solely because of timing differences between the logic circuits 140. A "no trips present" pulse train is applied on line 144 and the pulse train is passed serially through comparators 24A, 24B, 24C and 24D to produce a pulse train output on line 146 if the conditions being compared all compare satisfactorily. The pulse train signal on line 146 is applied to switch control 148 which maintains switch 150 open. Should the pulse train at line 146 cease, circuit 148 will release switch 150 and produce a trip condition signal on line 152. This fail safe comparator logic is compatible with conventional digital logic as indicated by AND circuit 154 which responds to the outputs of digital filters 142-1, 142-3, 142-5 and 142-7.

While particular embodiments of the invention have been shown and described, various modifications will be apparent to those skilled in the art and therefore it is not intended that the invention be limited to the disclosed embodiments or to details thereof and departures may be made therefrom within the spirit and scope of the invention as defined in the claims.

What is claimed is:

1. In a burner control system having a field device, said field device having circuitry to provide a field signal indicating the state of the field device, burner control logic for providing a control signal to change the state of said field device, a comparator for comparing said field signal and said control signal, said comparator comprising translation circuitry having a signal input terminal, a signal output terminal, and power supply conductors, and being arranged to produce a pulse train signal at said output terminal in response to a pulse train signal applied to said signal input terminal, and power supply circuitry connected to said power supply conductors, said power supply circuitry having first and second logic inputs and being arranged to apply power to said power supply conductors in response to a proper comparison between said field signal applied to said first logic input and said control signal applied to said second logic input and to remove power from said power supply conductors in response to a different set of field and control signals applied to said logic inputs that do not properly compare, circuitry to apply said field signal to said first logic input, circuitry to apply said control signal to said second logic input, and circuitry responsive to the pulse train signal at said output terminal for placing said field device in safe condition when said comparator does not produce said pulse train signal at said output terminal.

2. The system as claimed in claim 1 said field device is a valve for controlling the flow of fuel to a supervised combustion chamber and further including circuitry responsive to flame in the supervised combustion chamber for supplying a flame signal to said burner control logic.

3. The system as claimed in claim 2 wherein said translation circuitry includes first and second photomodule circuits, each said photomodule circuit including a radiation source and a radiation sensor, and circuitry connecting the radiation sensor of said first photomodule circuit to control the energization of the radiation source of said second photomodule circuit.

4. The system as claimed in claim 3 wherein said power supply circuitry includes a diode bridge network.

5. The system as claimed in claim 4 wherein each said logic input includes a buffer amplifier.

6. The system as claimed in claim 3 wherein each said photomodule further includes a solid state switch, the solid state switch of said first photomodule circuit being connected in shunt with the radiation source of said second photomodule circuit.

7. A fail safe self-checking comparator circuit comprising:

translation circuitry having a signal input terminal, a signal output terminal and first and second power supply conductors, and being arranged to produce a pulse train signal at said output terminal in response to a pulse train signal applied to said signal input terminal, and power supply circuitry connected to said power supply conductors, said power supply circuitry having first and second logic inputs and being arranged to apply power to said power supply terminals in response to a first set of control signals applied to said logic inputs and to remove power from said power supply terminals in response to a different set of logic signals applied to said logic inputs to disable said translation circuitry.

8. The circuit as claimed in claim 7 wherein said translation circuitry includes a photoisolator comprising a radiation source connected to said signal input terminal and a radiation sensor electrically spaced from and optically coupled to said radiation source.

9. The circuit as claimed in claim 7 wherein said power supply circuitry includes a diode network.

10. The circuit as claimed in claim 7 wherein said translation circuitry includes first and second photomodule circuits, each said photomodule circuit including a radiation source and a radiation sensor, and circuitry connecting the radiation sensor of said first photomodule circuit to control the energization of the radiation source of said second photomodule circuit.

11. The circuit as claimed in claim 10 wherein each said photomodule further includes a solid state switch, the solid state switch of said first photomodule circuit being connected in shunt with the radiation source of said second photomodule circuit.

12. The circuit as claimed in claim 11 wherein said power supply circuitry includes a diode bridge network and each said logic input includes a buffer amplifier, one of said buffer amplifiers having an inverted output.

* * * * *